United States Patent
Kondo (10) Patent No.: US 11,369,025 B2
(45) Date of Patent: Jun. 21, 2022

(54) BACKUP BLOCK AND SCREEN-PRINTING MACHINE

(71) Applicant: FUJI CORPORATION, Chiryu (JP)

(72) Inventor: Takeshi Kondo, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 75 days.

(21) Appl. No.: 16/958,918

(22) PCT Filed: Jan. 15, 2018

(86) PCT No.: PCT/JP2018/000790
§ 371 (c)(1),
(2) Date: Jun. 29, 2020

(87) PCT Pub. No.: WO2019/138569
PCT Pub. Date: Jul. 18, 2019

(65) Prior Publication Data
US 2020/0344889 A1    Oct. 29, 2020

(51) Int. Cl.
*H05K 3/12*    (2006.01)

(52) U.S. Cl.
CPC ... *H05K 3/1225* (2013.01); *H05K 2203/0139* (2013.01); *H05K 2203/0165* (2013.01); *H05K 2203/166* (2013.01)

(58) Field of Classification Search
CPC .............. B41J 15/20; H05K 2203/085; H05K 2203/0139; H05K 2203/166
See application file for complete search history.

(56) References Cited

U.S. PATENT DOCUMENTS

| 2013/0020379 A1* | 1/2013 | Kim ..................... H05K 3/1233 228/256 |
| 2015/0321464 A1 | 11/2015 | Horie et al. |
| 2017/0239764 A1 | 8/2017 | Mantani et al. |

FOREIGN PATENT DOCUMENTS

| JP | 9-8499 A | 1/1997 |
| JP | 2003224395 A * | 8/2003 |
| JP | 2005-297434 A | 10/2005 |

(Continued)

OTHER PUBLICATIONS

International Search Report dated Apr. 17, 2019 in PCT/JP2018/000790 filed on Jan. 15, 2018, 2 pages.

*Primary Examiner* — Matthew G Marini
*Assistant Examiner* — Marissa Ferguson-Samreth
(74) *Attorney, Agent, or Firm* — Oblon, McClelland, Maier & Neustadt, L.L.P.

(57) ABSTRACT

A screen-printing machine includes a mask holding device; a board holding device configured to grip a board; a positioning device to relatively position the board and the mask; and a control device. The board holding device includes a lifting and lowering table positioned in an up-down direction by a lifting and lowering mechanism, and a backup block including a mounting surface on which the board is placed, an installation surface disposed parallel to the mounting surface on an opposite side thereof, multiple suction holes to penetrate in a thickness direction between the mounting surface and the installation surface, and a chamber recessed section formed on an installation surface side so as to surround positions of the multiple suction holes, and in which an air chamber made by the chamber recessed section is configured when the backup block overlaps an upper face of the lifting and lowering table.

6 Claims, 5 Drawing Sheets

(56)  References Cited

FOREIGN PATENT DOCUMENTS

| | | | | |
|---|---|---|---|---|
| JP | 2005297434 | A | * | 10/2005 |
| JP | 2007-201275 | A | | 8/2007 |
| JP | 2010-56182 | A | | 3/2010 |
| JP | 2010056182 | A | * | 3/2010 |
| JP | 2016179669 | A | * | 10/2013 |
| JP | 2017069312 | A | * | 4/2017 |
| KR | 20140087498 | A | * | 7/2014 |

* cited by examiner

Prior Art

BACKUP BLOCK AND SCREEN-PRINTING MACHINE

TECHNICAL FIELD

The present application relates to a backup block used for a vacuum suction of boards and a screen-printing machine provided with the backup block.

BACKGROUND ART

In a screen-printing machine, a board is disposed under a mask on which print pattern holes are formed, and cream solder is spread on the mask. The cream solder is applied to the board through the print pattern holes, and accordingly, the printing is performed on the board in accordance with the print pattern. At this time, when there is a deviation in the adherence between the mask and the board for printing, printing defects, such as blurring of the print pattern, is caused to occur. Therefore, although each of the board and the mask is required for positional accuracy, there is a case where deflection occurs depending on the board, and there is also a case where the accuracy cannot reach the level that is required. Therefore, in the screen-printing machine, a backup block is employed for obtaining the flatness of the board for printing by sucking and holding the board by vacuum pumping.

PTL 1 described hereinafter discloses a technique related to a backup block. The backup block is a plate-shaped block body on which the board is placed on the upper face thereof, and has escape holes formed such that the mounted components do not hit a primary face of the board. The backup block is superposed on a base plate and integrated with the base plate by a fastening screw. An air chamber is configured such that a recessed section is formed on an upper face side on the base plate and closed by the backup block. Further, connecting holes are drilled on a lower face side of the base plate, and vacuum pumping by a vacuum pump is performed through the connecting holes. In addition, in the backup block, multiple suction holes are formed at positions superposing the recessed sections, and thus, the board is vacuum sucked through the suction holes.

PATENT LITERATURE

Patent Literature 1: JP-A-09-008499

BRIEF SUMMARY

Technical Problem

According to the above-described example in the related art, the inside of the recessed section of the base plate is vacuum pumped, the board is vacuum sucked through the suction holes of the backup block, and accordingly, even in a case of the board in which deflection occurs, the board is corrected to a planar shape by conforming with the upper face of the backup block. However, the backup block in the conventional art is integrated with the base plate so as to constitute the air chamber at the time of vacuum pumping with the recessed section thereof. In other words, the configuration has two components, but actually, the base plate is fixed to a lifting and lowering table of a lifting and lowering mechanism, for example. When the base plate described in PTL 1 is also functioning as a lifting and lowering table, and in a case where it is necessary to change the backup block in accordance with the board to be produced, the base plate needs also to be replaced, and its changeover becomes burdensome.

The backup block in the conventional art has a two-component structure. Therefore, it was difficult to secure a height precision of the backup block and a parallelism of the upper face, on which the board is placed, with high accuracy. Since the board height at the time of printing is adjusted to the level of several tens of microns, when the dimensional tolerances of the backup block and the base plate are accumulated, it was difficult to obtain the height or flatness with the accuracy required as described above. PTL 1 also discloses a case where a recessed section that configures the air chamber has a rectangular shape. However, as the area of the recessed section increases, the pressure receiving area at the time of vacuum pumping also increases, by which deflection in the backup block is likely to occur, which turns out decreasing the accuracy of printing with respect to the board.

In order to solve this problem, an object of the present disclosure is to provide a backup block configured with one component in which a recessed section for an air chamber is formed, and a screen-printing machine including the backup block.

Solution to Problem

According to an aspect of the present disclosure, there is provided a backup block including: a mounting surface on which a board is placed; an installation surface disposed parallel to the mounting surface on an opposite side thereof; multiple suction holes penetrating in a thickness direction between the mounting surface and the installation surface; and a chamber recessed section formed on an installation surface side so as to surround the positions of the multiple suction holes.

According to another aspect of the present disclosure, there is provided a screen-printing machine including: a mask holding device configured to hold a mask; a board holding device configured to grip a board supported from below in a horizontal direction; a positioning device configured to relatively position the board gripped by the board holding device and the mask held by the mask holding device; a squeegee device configured to spread cream solder over the mask; and a control device configured to perform drive control of each device, in which the board holding device includes a lifting and lowering table capable of being positioned in an up-down direction by a lifting and lowering mechanism, and a backup block including a mounting surface on which the board is placed, an installation surface disposed parallel to the mounting surface on an opposite side thereof, multiple suction holes configured to penetrate in a thickness direction between the mounting surface and the installation surface, and a chamber recessed section formed on an installation surface side so as to surround positions of the multiple suction holes, and in which a pressure reducer is connected to an air chamber made by the chamber recessed section configured when the backup block overlaps an upper face of the lifting and lowering table, through a suction hole formed to penetrate the lifting and lowering table.

Advantageous Effects

According to the above-described configuration, the air chamber is configured between the lifting and lowering table and the chamber recessed section formed on the installation surface side as the backup block overlaps the lifting and lowering table so as to be in contact with the installation surface, and the board placed on the mounting surface of the backup block is vacuum sucked by vacuum pumping with respect to the air chamber. At this time, since the backup block is configured with one component, it is possible to obtain an accuracy with respect to the height dimensions or the parallelism of the mounting surface, of which accuracy being different from that of two components type in the conventional arts, which enables to obtain a high printing quality.

DESCRIPTION OF EMBODIMENTS

Figure 1:
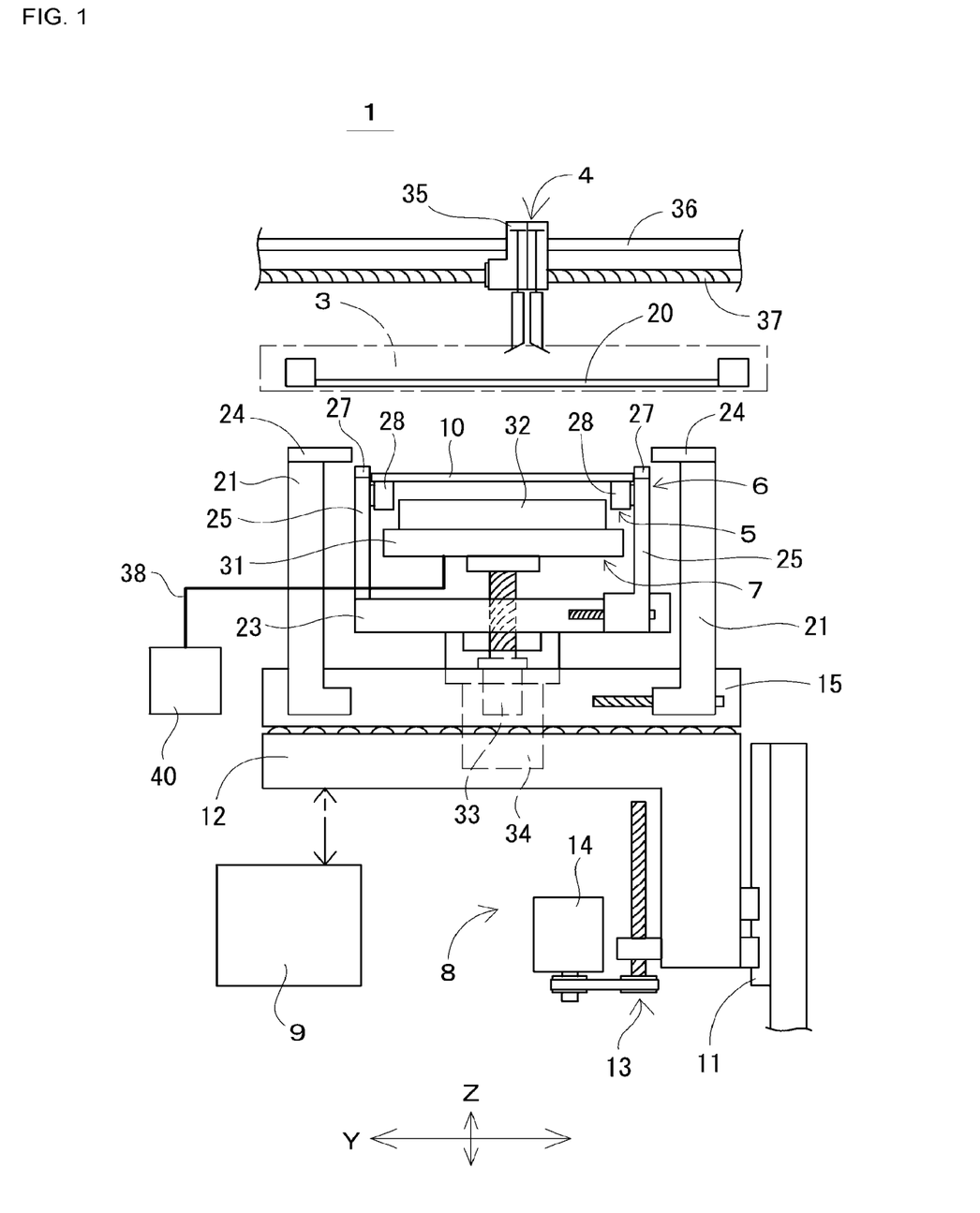
FIG. 1 is a view illustrating an internal structure of an embodiment of a screen-printing machine in a simplified manner.

Next, an embodiment of the backup block and the screen-printing machine according to the present disclosure will be described below with reference to the drawings. FIG. 1 is a view illustrating an internal structure of the screen-printing machine in a simplified manner, and is a view illustrating in a machine body width direction which is a conveyance direction of a board.

Screen-printing machine 1 is for printing cream solder on board 10, and, for example, configures a circuit board production line together with a solder inspector that inspects a print state, a component mounter that performs mounting of electronic components onto the board, and the like.

In screen-printing machine 1, the entire internal structure is covered with a machine body cover (not illustrated). Conveying ports are formed on both side faces in the machine body width direction on the machine body cover, and convey-in and convey-out of board 10 are performed. In the present embodiment, the machine body front-rear direction of screen-printing machine 1 will be described as the Y-axis direction, the machine body width direction passing through the drawing will be described as the X-axis direction, and the machine body height direction will be described as the Z-axis direction.

In screen-printing machine 1, board 10 is conveyed under mask 20 installed in the machine, and the cream solder passes through the print pattern hole from the upper face side of mask 20, and is applied to board 10 on the lower side, and accordingly, the print pattern is formed. Therefore, on the in-machine upper section side in screen-printing machine 1, mask 20 is held through a frame body to a pair of mask holders 3 arranged in the machine body width direction. On the upper side of mask holder 3, squeegee device 4 movable in the machine body front-rear direction is assembled. Meanwhile, on the lower side of mask holder 3, board conveyance device 5 that conveys in and out board 10 in the machine body width direction, clamping device 6 for clamping board 10 in the machine body front-rear direction, backup device 7 for vertically moving board 10 to the clamping position, and the like are assembled to lifting and lowering device 8.

Lifting and lowering device 8 is provided with lifting and lowering base 12 which slides along perpendicular guide rail 11, and lifting and lowering base 12 is connected to lifting and lowering motor 14 via ball screw mechanism 13. On lifting and lowering base 12, board conveyance device 5, clamping device 6 and the like are mounted via support table 15. On support table 15, a pair of mask supports 21 are provided in the machine body front-rear direction (Y-axis direction), and mask supporting plate 24 that is in contact with mask 20 is fixed to the upper faces of mask supports 21. The ball screw mechanism provided on mask support 21 on the right side of the drawing is driven by a servomotor, and it is possible to adjust the distance to mask support 21 on the left side of the drawing.

Clamping device 6 includes a pair of side frames 25 in the machine body front-rear direction orthogonal to the conveyance direction of board 10, and is assembled onto support table 23. The ball screw mechanism provided in side frame 25 on the right side of the drawing is driven by a servomotor, and it is possible to adjust the distance to side frame 25 on the left side of the drawing. Clamp section 27 is formed at the upper end section of each side frame 25, the distance between clamp sections 27 is reduced, and accordingly, board 10 can be gripped.

On the inner side of side frame 25, board conveyance device 5 configured with conveyor belt 28 is assembled, and backup device 7 for further gripping conveyed board 10 at an accurate position with respect to clamp section 27 is provided. Backup device 7 is configured such that lifting and lowering table 31 on which backup block 32 is mounted can be lifted and lowered by servomotor 33 through the ball screw mechanism. Then, clamping device 6 including backup device 7, support table 23 is supported via the ball screw mechanism, and is configured to be lifted and lowered by servomotor 34.

On board 10 held by backup device 7 or the like, positioning is performed by a correction device that performs lifting and lowering of lifting and lowering device 8 with respect to mask 20 and position adjustment between mask 20 and board 10. A configuration in which the position of support table 15 with respect to lifting and lowering base 12 can be adjusted in the X-direction, the Y-direction, and the θ direction is provided, and the positioning between board 10 and mask 20 is performed. In addition, the position adjustment in the X-direction, the Y-direction, and the θ direction may be performed such that the correction device is configured in mask holder 3 that holds mask 20.

Squeegee device 4 is mounted in a state where a pair of squeegees can be lifted and lowered with respect to traveling table 35. Traveling table 35 is slidably assembled to guide rod 36, and through the ball screw mechanism made of screw shaft 37 parallel to guide rod 36, the linear movement in the machine body front-rear direction is possible by the drive of the servomotor. Then, control device 9 that controls the overall drive is mounted on such screen-printing machine 1, and the drive control is performed on a driving section of each device.

Incidentally, the positioning of board 10 in the up-down direction is performed by drive control of servomotors 33 and 34 of backup device 7 or clamping device 6. Moreover, since the positioning accuracy is in units of several tens of microns, there is a case where the deflection of board 10 itself is not acceptable. Here, backup device 7 can be replaced with backup block 32 for performing vacuum sucking in addition to the backup pins as a configuration for directly supporting board 10. Then, in order to vacuum pumping the inside of the air chamber configured with backup block 32, air hose 38 is attached to lifting and lowering table 31, and vacuum pump 40 is connected.

Figure 5:
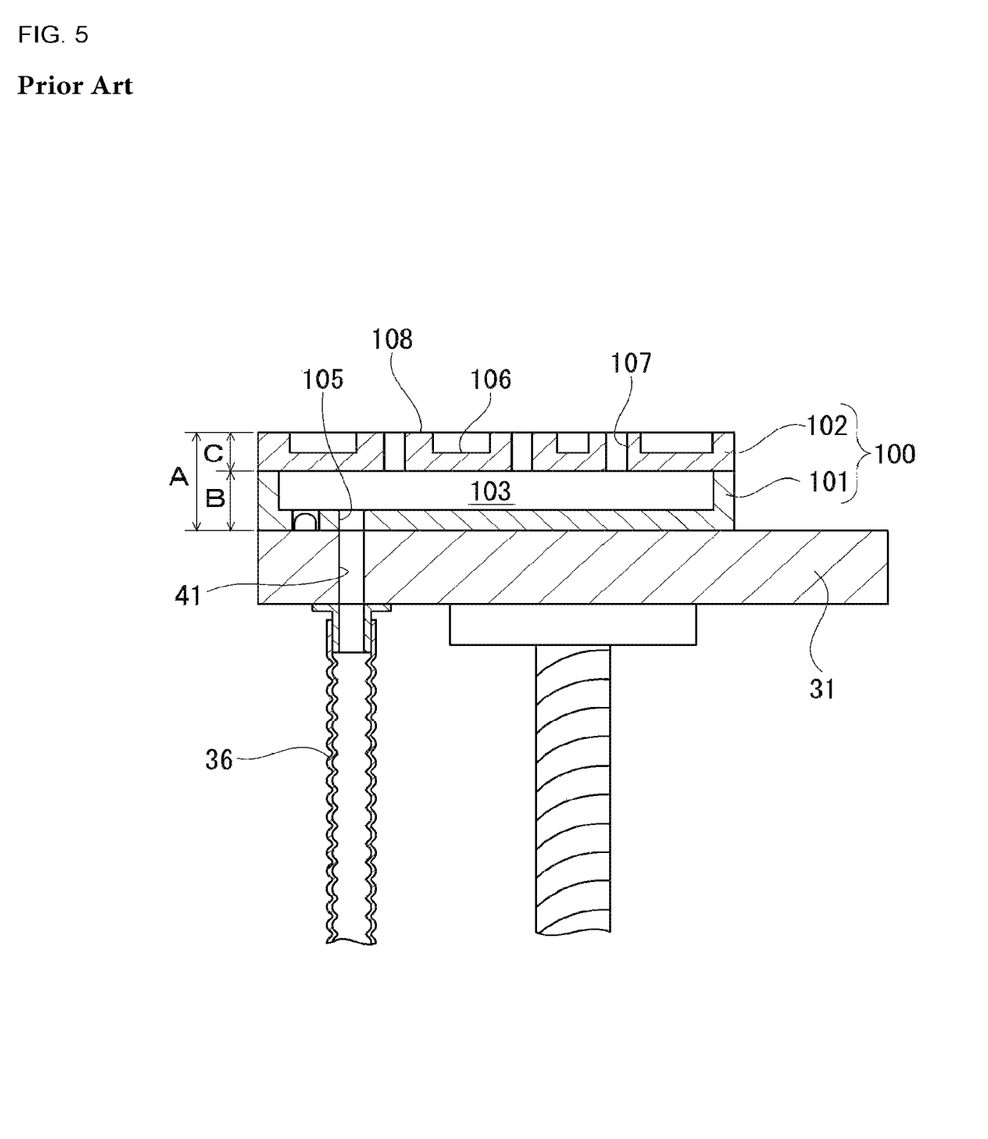
FIG. 5 is a sectional view illustrating a backup block in the related art.

Since the backup block in the related art that configures the air chamber is configured with two components as described in the above-described problems, it is difficult to obtain an accuracy in units of several tens of microns, and this becomes a factor of an increase in processing cost. FIG. 5 is a sectional view illustrating a backup block in the related art that can be assembled to backup device 7 of the present embodiment. On lifting and lowering table 31, suction hole 41 that penetrates in the thickness direction is formed, and air hose 38 connected to vacuum pump 40 is attached from below. Then, suction hole 41 communicates with air chamber 103 of backup block 100.

Backup block 100 is a plate-shaped block having an area corresponding to the size of board 10 and is divided into two in the vertical thickness direction. In other words, in backup block 100, lid-shaped upper face member 102 overlaps vessel-shaped base member 101, both are screwed to be integrated with each other, and a cavity that becomes air chamber 103 is formed on the inside thereof. Connection hole 105 is formed in the bottom section of base member 101, and backup block 100 is disposed such that connection hole 105 overlaps suction hole 41 of lifting and lowering table 31. Meanwhile, on upper face member 102, multiple escape holes 106 for making the electronic components mounted on the primary face of board 10 escape, and multiple suction holes 107 for vacuum suction of board 10 are formed.

Backup block 100 is designed such that thickness dimension A is 30 mm, thickness dimension B of base member 101 is 20 mm, thickness dimension C of upper face member 102 is 10 mm. However, since the dimensional tolerance occurs when processing base member 101 and upper face member 102, even when each member is within the tolerance range, the sum total of the two components, that is, backup block 100 may exceed the error of the permissible range. Further, for the accurate mounting of the electronic components, in addition to the thickness dimensions, board 10 is required to be parallel, but even in a case of obtaining the parallelism of mounting surface 108 of backup block 100, superposition of base member 101 and upper face member 102 decreases the accuracy.

Figure 2:
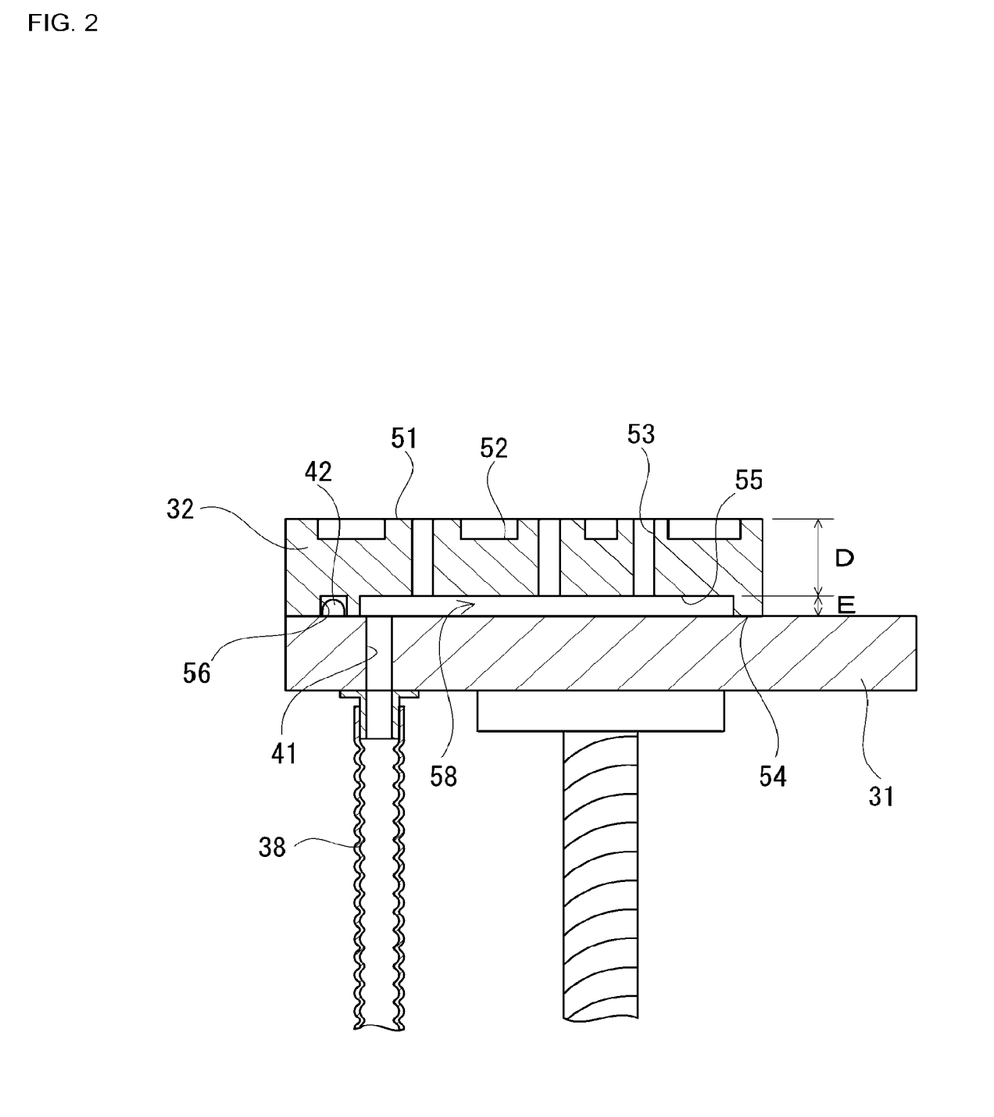
FIG. 2 is a sectional view illustrating an embodiment of a backup block.
Figure 3:
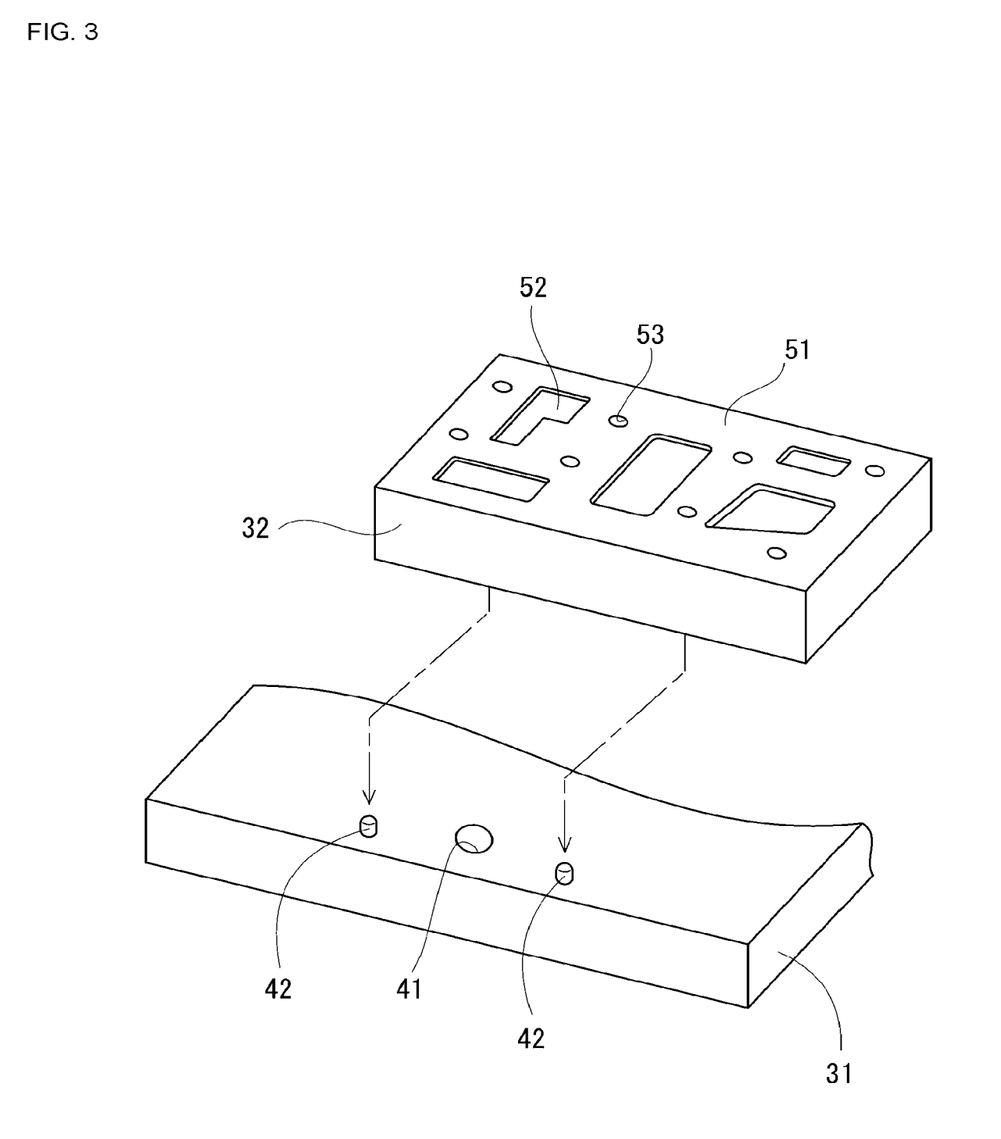
FIG. 3 is a perspective view illustrating an embodiment of the backup block.

On the other hand, FIG. 2 is a sectional view illustrating backup block 32 of the present embodiment, and FIG. 3 is a perspective view of same backup block 32. Backup block 32 is designed such that the thickness dimension is 30 mm similar to the example in the related art illustrated in FIG. 5 by one member. Backup block 32 is a plate-shaped block having an area corresponding to the size of board 10 which is the target. Multiple escape holes 52 for making the electronic components mounted on the primary face of board 10 escape are formed with a predetermined depth on mounting surface 51 which is the upper face, and multiple suction holes 53 for vacuum suction of board 10 are formed.

Figure 4:
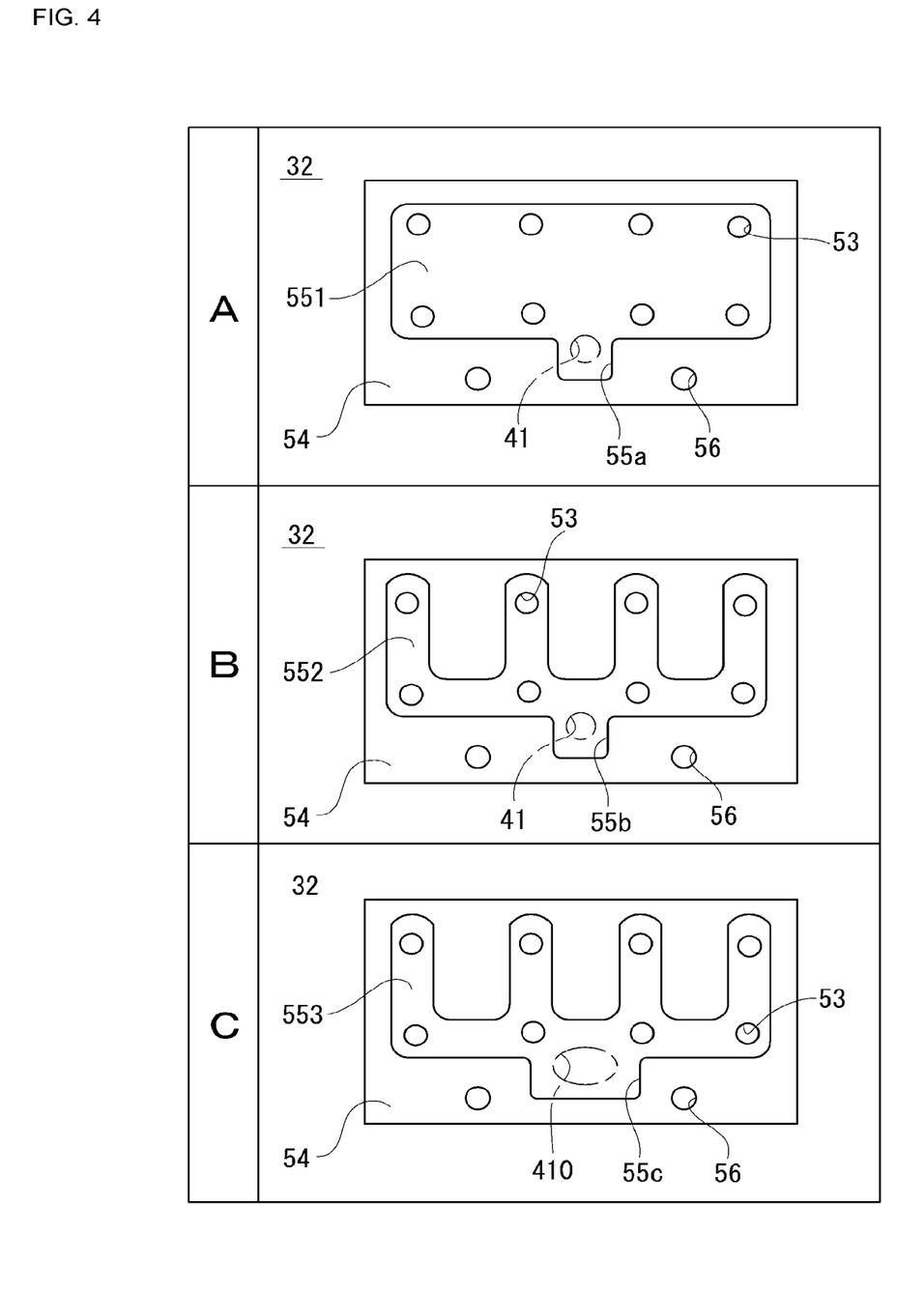
FIG. 4 is a view illustrating an example of a chamber recessed section formed in the backup block.

Rear face which is the opposite side of mounting surface 51 is installation surface 54 that is in direct contact with the upper face of lifting and lowering table 31. Mounting surface 51 and installation surface 54 are parallel surfaces, and backup block 32 is formed to have a constant thickness. In addition, in backup block 32 of the present embodiment, chamber recessed section 55 is formed on installation surface 54 side. Here, FIG. 4 is a plan view on installation surface 54 side of backup block 32 illustrating chamber recessed section of three patterns.

Chamber recessed section 55 (551, 552, and 553) are formed so as to surround all the positions of multiple suction holes 53. Chamber recessed sections 551, 552, and 553 illustrated in FIG. 4 have the same positions of the multiple suction holes 53. However, since the position of suction hole 53 is different depending on the position and size of escape hole 52 formed on mounting surface 51 side, the size or shape of chamber recessed section 55 becomes different, respectively. In this regard, the shape of chamber recessed section 551 of pattern A formed on entire installation surface 54, specifically, the rectangular shape surrounding all the positions of multiple suction holes 53 is a general shape. Meanwhile, chamber recessed sections 552 and 553 of patterns B and C have a groove shape connecting all the positions of the multiple suction holes 53, and vary depending on the positions of suction holes 53.

In backup block 32, as illustrated in FIG. 2, backup block 32 overlaps the upper face of lifting and lowering table 31 with installation surface 54 downward, chamber recessed section 55 which is opened downward is closed, and the cavity is formed as air chamber 58. At this time, suction hole 41 of lifting and lowering table 31 communicates with air chamber 58 is further connected to vacuum pump 40 via air hose 38. On the upper face of lifting and lowering table 31, positioning projections 42 protrude at two locations such that backup block 32 is attached to a regular position. Meanwhile, in backup block 32, positioning holes 56 on installation surface 54 side are formed at two locations. During the changeover, as positioning projection 42 enters positioning hole 56, backup block 32 is disposed at a regular position on the upper face of lifting and lowering table 31.

Next, the action of screen-printing machine 1 will be described. In screen-printing machine 1, board 10 is conveyed between side frames 25 by conveyor belt 28, lifting and lowering table 31 is lifted by the drive of servomotor 33, and board 10 is uplifted from conveyor belt 28 by backup block 32. At this time, the air in air chamber 58 configured with lifting and lowering table 31 and backup block 32 is suctioned by vacuum pump 40. Therefore, in air chamber 58 in which suction holes 53 are closed, the inside air is suctioned out by vacuum pump 40, and board 10 is sucked and held on mounting surface 51 of backup block 32 by increasing degree of vacuum. Accordingly, the entire body is a horizontal surface following mounting surface 51 even in a case of board 10 with deflection.

Next, board 10 is held being sandwiched in the Y-axis direction by a pair of clamp sections 27, clamping device 6 is lifted, and accordingly, board 10 is aligned with the height of mask supporting plate 24. Thereafter, the mark attached to board 10 by a camera (not illustrated) is imaged, the positional deviation amounts of relative positions in the X, Y, and 9 directions with respect to board 10 and mask 20 are calculated, and the positional deviation correction is performed by the correction device configured with support table 15. Then, lifting and lowering base 12 is lifted by the drive of lifting and lowering motor 14, board 10 is pushed up until reaching the board moving height, and board 10 is positioned with respect to mask 20.

Mask 20 is pressed against board 10 by squeegee device 4 and the cream solder rolled by a moving squeegee is pushed into the print pattern holes of mask 20. Thereafter, plate separation is performed to lower board 10 at a predetermined speed by driving servomotor 34, the cream solder is printed on board 10 according to the print pattern. In the plate separation, the adjustment of the lowering speed of board 10 separated from mask 20 is performed, but according to the present embodiment, since the planar state of board 10 is maintained by vacuum pumping, the accurate plate separation is possible, and high-accuracy printing in accordance with the print pattern is performed.

In particular, since backup block 32 of the present embodiment is configured with one component, it is possible to obtain the accuracy related to the height dimension or the parallelism of mounting surface 51 unlike the configuration having two components in the related art. Then, backup block 32 which is one component does not require assembly work, it is only necessary to dispose backup block 32 on the upper face of lifting and lowering table 31 by aligning positioning holes 56 to positioning projections 42, and thus, it is also possible to easily perform the changeover.

Further, in backup block 100 in the related art configured with two components, upper face member 102 is prepared for each different board type. However, since the position of suction hole 107 becomes different depending on the board, when making base member 101 common for multiple upper face members 102, air chamber 103 requires to have a general rectangular shape formed on entire base member 101. On the other hand, in backup block 32 which is one component, suction hole 53 and chamber recessed section 55 are formed integrally, and thus, the degree of freedom of the shape of air chamber 58, that is, chamber recessed section 55, is high.

Further, since lifting and lowering table 31 serves as a bottom face of air chamber 58, backup block 32 having a thickness limit can thicken thickness D (refer to FIG. 2) of mounting surface 51 side. Accordingly, in backup block 32, with respect to the negative pressure when the inside of air chamber 58 is vacuum pumped, it is possible to secure the rigidity only to maintain a planar state without deflecting mounting surface 51. In other words, when increasing the thickness dimension of backup block 32, in conjunction therewith, the dimension in the height direction (Z-axis direction) of backup device 7 or the like increases, but it is possible to increase the rigidity at the time of vacuum pumping without increasing the thickness dimension.

For example, backup block 32 of the present embodiment has a thickness dimension of 30 mm. In backup block 100 in the related art formed having the same thickness, thickness dimension C of upper face member 102 is 10 mm, and thus, there was a case where deflection occurs due to the negative pressure of the vacuum pumping; however, in backup block 32 of the present embodiment, thickness D of mounting surface 51 side can be formed to be 20 to 25 mm, and thus, even in a case of chamber recessed section 551 illustrated in FIG. 4, it is possible to maintain a planar state without deflecting mounting surface 51 with respect to the negative pressure in air chamber 58.

While the processing is easy since chamber recessed section 551 can be formed regardless of the position of suction hole 53 as compared with those of the other groove shapes, the deflection easily occurs since the pressure receiving area of the negative pressure applied to the inside of air chamber 58 increases. For example, using the vertical and horizontal pressure receiving area (250 mm×350 mm) in common, regarding two aluminum plates having different plate thicknesses of 10 mm and 25 mm, the comparison calculation of deflection was performed while the ultimate pressure of the vacuum pump was set as 8 kPa. As a result, while the maximum deflection amount of the aluminum plate is 0.0538 mm in a case where the plate thickness is 10 mm, the maximum deflection amount was 0.0036 mm in a case where the plate thickness is 25 mm. By adding not only dimensional tolerance but also large deflection of vacuum pumping, backup block 100 in the related art exceeds the allowable error in plate separation of board 10, and the printing accuracy is decreased. On the other hand, in backup block 32 of the present embodiment, it is possible to suppress the error in the dimensional tolerance and the deflection of the vacuum pumping to be extremely small, and it is possible to perform printing with high accuracy.

Accordingly, in backup block 32, in a case of chamber recessed section 551, it is preferable that the dimension of thickness D of mounting surface 51 side is larger, and for example, depth dimension E to the bottom face of at least chamber recessed section 551 is made smaller than the dimension of thickness D. Meanwhile, since chamber recessed sections 552 and 553 illustrated in FIG. 4 have a groove shape, the pressure receiving area is extremely small as compared with chamber recessed section 551, and thus, it is possible to make it unlikely to receive the influence of the deflection in the vacuum pumping.

In addition, in backup block 32 of the present embodiment, chamber recessed section 55 has a shape that is widely opened, and thus, it is not necessary to form connection hole 105 (refer to FIG. 5) corresponding to suction hole 41 of lifting and lowering table 31. Although connection hole 105 requires the positional accuracy, the positional accuracy is not required in a case of the chamber recessed section 55, and thus, it is possible to suppress the processing cost. In chamber recessed section 55, as illustrated in FIG. 4, connecting sections 55*a*, 55*b*, and 55*c* are formed at a position relative to suction port 41. Suction hole 41 may overlap the positions of connecting sections 55*a*, 55*b*, and 55*c*.

Incidentally, chamber recessed section 553 of pattern C, connecting section 55*c* is formed large. This is because suction hole 410 is formed large with respect to lifting and lowering table 31 and is aligned with the size. Suction hole 410 is configured to be formed larger than the connection port of air hose 38 and to be capable of efficiently discharging the air in air chamber 58 configured with chamber recessed section 553 as a flow path. Accordingly, by enlarging suction hole 410 for the air discharge part of air chamber 58, it is possible to efficiently perform vacuum pumping even with same vacuum pump 40, and it is possible to not only increase suction effect of board 10 to be vacuum sucked but also to shorten the time until the state where board 10 is sucked and held is stabilized.

Although an embodiment of the present disclosure has been described above, the present disclosure is not limited thereto, and various changes can be made within the range that does not depart from the spirit thereof. For example, chamber recessed section 55 (551, 552, and 553) illustrated as the configuration of backup block 32 of the embodiment are examples, and may have different shapes, arrangements, or sizes.

REFERENCE SIGNS LIST

1 . . . screen-printing machine, 3 . . . mask holder, 4 . . . squeegee device, 5 . . . board conveyance device, 6 . . . clamping device, 7 . . . backup device, 8 . . . lifting and lowering device, 10 . . . board, 20 . . . mask, 31 . . . lifting and lowering table, 32 . . . backup block, 38 . . . air hose, 40 . . . vacuum pump, 42 . . . positioning projection, 51 . . . mounting surface, 52 . . . escape hole, 53 . . . suction hole, 54 . . . installation surface, 55 (551, 552, 553) . . . chamber recessed section, 56 . . . positioning hole, 58 . . . air chamber

The invention claimed is:

1. A backup block comprising:
   a mounting surface on which a board is placed;
   an installation surface disposed parallel to the mounting surface on an opposite side thereof;

multiple suction holes configured to penetrate in a thickness direction between the mounting surface and the installation surface; and a chamber recessed section formed on an installation surface side so as to surround positions of the multiple suction holes, wherein the backup block is a single piece component, wherein the chamber recessed section and the multiple suction holes are integrally formed, and wherein a bottom face of the chamber recessed section is offset towards the mounting surface from the installation surface in the thickness direction such that a depth dimension from the installation surface to the bottom face of the chamber recessed section in the thickness direction is smaller than a thickness dimension from the bottom face of the chamber recessed section to the mounting surface in the thickness direction.

2. The backup block according to claim 1,
wherein the chamber recessed section has a groove shape connecting the positions of the multiple suction holes.

3. The backup block according to claim 1,
wherein a positioning hole into which a positioning pin is insertable is formed on the installation surface side.

4. A screen-printing machine comprising:
a mask holding device configured to hold a mask;
a board holding device configured to grip a board supported from below in a horizontal direction;
a positioning device configured to relatively position the board gripped by the board holding device and the mask held by the mask holding device;
a squeegee device configured to spread cream solder over the mask; and
a control device configured to perform drive control of each device,
wherein the board holding device includes
  a lifting and lowering table capable of being positioned in an up-down direction by a lifting and lowering mechanism, and
  a backup block including
    a mounting surface on which the board is placed,
    an installation surface disposed parallel to the mounting surface on an opposite side thereof,
    multiple suction holes configured to penetrate in a thickness direction between the mounting surface and the installation surface, and
    a chamber recessed section formed on an installation surface side so as to surround positions of the multiple suction holes,
    wherein the backup block is a single piece component,
    wherein the chamber recessed section and the multiple suction holes are integrally formed, and
    wherein a bottom face of the chamber recessed section is offset towards the mounting surface from the installation surface in the thickness direction such that a depth dimension from the installation surface to the bottom face of the chamber recessed section in the thickness direction is smaller than a thickness dimension from the bottom face of the chamber recessed section to the mounting surface in the thickness direction, and
wherein a pressure reducer is connected to an air chamber configured by the chamber recessed section configured when the backup block overlaps an upper face of the lifting and lowering table, through a suction hole formed to penetrate the lifting and lowering table.

5. The screen-printing machine according to claim 4,
wherein the suction hole is formed to be larger than a connection port of an air hose connected to the pressure reducer.

6. The screen-printing machine according to claim 4,
wherein a positioning pin is formed to protrude on the upper face of the lifting and lowering table, and a positioning hole into which the positioning pin enters is formed on the installation surface side of the backup block.

* * * * *